US006831015B1

(12) United States Patent
Inoue et al.

(10) Patent No.: US 6,831,015 B1
(45) Date of Patent: Dec. 14, 2004

(54) FABRICATION METHOD OF SEMICONDUCTOR DEVICE AND ABRASIVE LIQUID USED THEREIN

(75) Inventors: Yasunori Inoue, Gifu (JP); Yoshio Okayama, Gifu (JP)

(73) Assignee: Sanyo Electric Co., Ltd., Moriguchi (JP)

(*) Notice: Subject to any disclaimer, the term of this patent is extended or adjusted under 35 U.S.C. 154(b) by 0 days.

(21) Appl. No.: 08/921,250

(22) Filed: Aug. 29, 1997

(30) Foreign Application Priority Data

Aug. 30, 1996 (JP) ............................................. 8-230826
Jan. 23, 1997 (JP) ............................................. 9-010426

(51) Int. Cl.[7] .......................................... H01L 21/302
(52) U.S. Cl. .................. 438/692; 438/595; 438/783; 438/784; 438/751
(58) Field of Search ................................. 438/595, 783, 438/784, 692, 751

(56) References Cited

U.S. PATENT DOCUMENTS

| 3,747,203 | A |   | 7/1973  | Shannon ..................... 29/578 |
| 4,668,973 | A |   | 5/1987  | Dawson et al. |
| 4,676,867 | A |   | 6/1987  | Elkins et al. |
| 4,775,550 | A |   | 10/1988 | Chu et al. ..................... 427/38 |
| 4,885,262 | A |   | 12/1989 | Ting et al. ................... 437/231 |
| 4,962,052 | A |   | 10/1990 | Asayama et al. ........... 438/234 |
| 4,983,546 | A |   | 1/1991  | Hyun et al. ................. 437/231 |
| 4,984,055 | A |   | 1/1991  | Okumura et al. ........... 257/644 |
| 5,003,062 | A |   | 3/1991  | Yen ............................. 437/231 |
| 5,024,723 | A | * | 6/1991  | Goesele et al. ............. 156/628 |
| 5,084,412 | A |   | 1/1992  | Nakasaki |
| 5,087,589 | A |   | 2/1992  | Chapman et al. |
| 5,106,787 | A |   | 4/1992  | Yen ............................. 437/231 |
| 5,153,680 | A |   | 10/1992 | Naito et al. ..................... 357/8 |
| 5,166,768 | A |   | 11/1992 | Ito ............................... 257/523 |

(List continued on next page.)

FOREIGN PATENT DOCUMENTS

| DE | 4218495 A1 | 12/1992 |
| EP | 0 602 607 A1 | 6/1994 |
| JP | 62-000242 | * 3/1981 |
| JP | 56-125844 | 10/1981 |

(List continued on next page.)

OTHER PUBLICATIONS

Ser. No. 09/320,271, Filed May 27, 1999 (U.S. Publication No. 20010055873, Publication date Dec. 27, 2001).

Ser. No. 09/228,148, Filed Jan. 11, 1999.

Ser. No. 09/716,334, Filed Nov. 21, 2000.

Wolf, et al. "Silicon Processing for the VLSI Era: Vol. 1—Process Technology," Lattice Press, 1986 p.441.

S.M. Sze, Physics of Semiconductor Device, "A Wiley Interscience publication.", p. 393, 1981.

Wang et al., "A Study of Plasma Treatments on Siloxane SOB," IEEE VMIC Conference, Jun. 7–8, 1994, pp. 101–107.

(List continued on next page.)

Primary Examiner—George A. Goudreau
(74) Attorney, Agent, or Firm—Westerman, Hattori, Daniels & Adrian, LLP

(57) ABSTRACT

A fabrication method of a semiconductor device improved in the polishing rate of an insulation film and less likely to generate a defect during polishing is obtained. In this fabrication of a semiconductor device, impurities are introduced into a first insulation film, and then planarization is effected by polishing the surface of the first insulation film. Thus, the polishing rate of the portion of the first insulation film in which impurities are introduced is improved. Also a defect is not easily generated therein.

24 Claims, 14 Drawing Sheets

U.S. PATENT DOCUMENTS

| | | | |
|---|---|---|---|
| 5,186,745 A | 2/1993 | Maniar | |
| 5,192,697 A | 3/1993 | Leong | 437/37 |
| 5,270,259 A | 12/1993 | Itoh et al. | 437/235 |
| 5,310,700 A | 5/1994 | Lien et al. | |
| 5,314,834 A | 5/1994 | Mazure et al. | |
| 5,314,843 A * | 5/1994 | Yu et al. | 437/225 |
| 5,341,026 A | 8/1994 | Harada et al. | |
| 5,352,630 A | 10/1994 | Kim et al. | 437/195 |
| 5,373,192 A | 12/1994 | Eguchi | |
| 5,387,812 A | 2/1995 | Forouhi et al. | |
| 5,404,046 A | 4/1995 | Matsumoto et al. | 257/750 |
| 5,429,990 A | 7/1995 | Liu et al. | 437/190 |
| 5,459,086 A | 10/1995 | Yang | |
| 5,468,684 A | 11/1995 | Yoshimori et al. | 437/228 |
| 5,479,054 A | 12/1995 | Tottori | |
| 5,496,776 A | 3/1996 | Chien et al. | |
| 5,514,910 A | 5/1996 | Koyama | |
| 5,519,254 A | 5/1996 | Tabara | |
| 5,523,616 A | 6/1996 | Den | |
| 5,549,786 A | 8/1996 | Jones et al. | 156/662.1 |
| 5,569,618 A | 10/1996 | Matsubara | |
| 5,581,101 A | 12/1996 | Ning et al. | 257/347 |
| 5,607,880 A | 3/1997 | Suzuki et al. | |
| 5,616,513 A * | 4/1997 | Shepard | 438/402 |
| 5,665,845 A | 9/1997 | Allman | |
| 5,674,784 A * | 10/1997 | Jang et al. | 437/195 |
| 5,702,568 A | 12/1997 | Shin et al. | |
| 5,723,895 A * | 3/1998 | Takahashi | 257/499 |
| 5,753,975 A | 5/1998 | Matsuno | |
| 5,786,273 A | 7/1998 | Hibi et al. | 438/637 |
| 5,817,582 A | 10/1998 | Maniar | |
| 5,818,068 A | 10/1998 | Sasaki et al. | |
| 5,830,773 A * | 11/1998 | Brennan et al. | 437/67 |
| 5,855,962 A | 1/1999 | Cote et al. | |
| 5,863,702 A | 1/1999 | Ohbayashi et al. | |
| 5,892,269 A | 4/1999 | Inoue et al. | |
| 5,898,221 A | 4/1999 | Mizuhara et al. | 257/751 |
| 5,930,624 A | 7/1999 | Murata et al. | 438/253 |
| 5,960,321 A | 9/1999 | Hsieh et al. | |
| 5,963,827 A | 10/1999 | Enomoto et al. | 438/629 |
| 6,001,745 A | 12/1999 | Tu et al. | |
| 6,013,578 A | 1/2000 | Jun | 438/687 |
| 6,071,807 A | 6/2000 | Watanabe et al. | |
| 6,071,810 A | 6/2000 | Wada et al. | |
| 6,136,686 A | 10/2000 | Gambino et al. | |
| 6,153,519 A | 11/2000 | Jain et al. | |
| 6,235,648 B1 | 5/2001 | Mizuhara et al. | |
| 6,288,438 B1 | 9/2001 | Mizuhara et al. | |

FOREIGN PATENT DOCUMENTS

| | | |
|---|---|---|
| JP | 62-60242 | 3/1987 |
| JP | 63-198359 | 8/1988 |
| JP | 1-199456 | 8/1989 |
| JP | 1-307247 | 12/1989 |
| JP | 2-7451 | 1/1990 |
| JP | 2-26055 | 1/1990 |
| JP | 2-101532 | 8/1990 |
| JP | 2-235358 | 9/1990 |
| JP | 2-253643 | 10/1990 |
| JP | 3-101130 | 4/1991 |
| JP | 4-234149 | 8/1992 |
| JP | 4-307934 A | 10/1992 |
| JP | 4-317358 | 11/1992 |
| JP | 5-74963 | 3/1993 |
| JP | 5-198523 | 8/1993 |
| JP | 5-226334 | 9/1993 |
| JP | 6-275229 | 9/1994 |
| JP | 6-291202 | 10/1994 |
| JP | 6-349950 | 12/1994 |
| JP | 7-99195 | 4/1995 |
| JP | 8-17770 | 1/1996 |
| JP | 8-64561 | 3/1996 |
| JP | 09-069562 | 3/1997 |
| JP | 9-246375 | 9/1997 |
| JP | 09-293783 | 11/1997 |
| JP | 9-312339 | 12/1997 |
| JP | 9-330982 | 12/1997 |
| JP | 10-189724 | 7/1998 |
| JP | 10-209147 | 8/1998 |
| JP | 63-199859 | 8/1998 |
| JP | 10-242277 | 9/1998 |
| JP | 10-242278 | 9/1998 |
| JP | 10-270447 | 10/1998 |
| JP | 10-303295 | 11/1998 |
| KP | 0179563 | 11/1998 |

OTHER PUBLICATIONS

Chiang et al., Defects Study on Spin on Glass Planarization Technology, IEEE VMIC Conference, Jun. 15–16, 1987, pp. 404–412.

Lai–Juh Chen, et al., "Fluorine–Implanted Treatment (FIT) SOG for the Non–Etchback Intermetal Dielectric," IEEE VMIC Conference, Jun. 7–8, 1994, pp. 81–86.

Moriya et al., "Modification Effects in Ion–Implanted $SiO_2$ Spin–on–Glass," *J. Electrochem, Soc.,* vol. 140, No. 5, May 1993, pp. 1442–1450.

Matsuura et al., "An Advanced Interlayer Dielectric System with Partially Converted Organic SOG Using Plasma Treatment," IEEE VMIC Conference, Jun. 8–9, 1993, pp. 113–115.

Ishida et al., "Mechanism for ALSiCu alloy Corrosion," *Jpn. J. Appl. Phys.,* vol. 31 (1992), pp. 2045–2048.

Doki et al., "Moisture–Blocking Mechanism of ECR–Plasma," IEEE VMIC Conference, Jun. 7–8, 1994, pp. 235–139.

Shimokawa et al., "Supression of MOSFET hot carrier degradation by P–SiO underLayer," *The Institute of Electronics, Information and Communication Engineers,* Technical Report of IEICE, SDM92–133 (Dec. 1992), pp. 89–94.

Murase et al., "Dielectric Constant of Silicon Dioxide Deposited by Atmospheric–Pressure Chemical Vapor Deposition Using Tetraethylorthosilicate and Ozone," *Jpn. J. Appl. Phys.,* vol. 33 (1994), pp. 1385–1389.

*Lithography 1: Optical Resist Materials and Process Technology,* pp. 441.

Silicon Processing for the VLSI Era —vol. II; 4.4.9.1 SOG Process Interfration, pp. 232.

Moriya et al., "Modification Effects in Ion–Implanted $SiO_2$ Spin–on–Glass," *J. Electrochem, Soc.,* vol. 140, No. 5, May 1993, pp. 1442–1450.

Ishida et al., "Mechanism for ALSiCu alloy Corrosion," *Jpn. J. Appl. Phys.,* vol. 31 (1992), pp. 2045–2048.

Murase et al., "Dielectric Constant of Silicon Dioxide Deposited by Atmospheric–Pressure Chemical Vapor Deposition Using Tetraethylorthosilicate and Ozone," *Jpn. J. Appl. Phys.,* vol. 33 (1994), pp. 1385–1389.

1995 Proceedings—Twelfth International VSLI Multilevel Interconnection Conference (VMIC); Catalog No. 95ISMIC—104, Jun. 27–29, 1995, Santa Clara, CA.

* cited by examiner

FABRICATION METHOD OF SEMICONDUCTOR DEVICE AND ABRASIVE LIQUID USED THEREIN

BACKGROUND OF THE INVENTION

1. Field of the Invention

The present invention relates to a method of fabricating a semiconductor device, and abrasive liquid used therein. More particularly, the present invention relates to a fabrication method of a semiconductor device including the step of planarizing an insulation film, and abrasive liquid used therein.

2. Description of the Background Art

Reducing the size of interconnections and providing multilayers are now required to further increase the integration density of semiconductor integrated circuit devices. An interlayer insulation film is provided between each interconnection to obtain a multilayer structure of the interconnection. If the surface of this interlayer insulation film is not planar, a step-graded portion will be generated at the interconnection formed above the interlayer insulation film. This will cause defects such as disconnection.

Therefore, the surface of the interlayer insulation film (the surface of the device) must be made as flat as possible. The technique to planarize the surface of the device is called planarization. This planarization technique has become important in reducing the size and providing multilayers of the interconnection.

The following two methods are known as conventional planarization techniques. As the first method, planarization using an SOG (Spin On Glass) film is known. The technique of planarization using an SOG film will be described hereinafter.

An SOG film is known as the most commonly used interlayer insulation film in the planarization art. In recent years, development in the planarization technique taking advantage of fluidity of a material of the interlayer insulation film is particularly noticeable.

An "SOG film" is a generic term of a film mainly composed of a solution in which a silicon compound is dissolved in an organic solvent, and silicon dioxide formed from that solution. In forming an SOG film, first a solution having a silicon compound dissolved in an organic solvent is applied in droplets while the substrate is rotated. By this rotation, the solution coating is provided so as to alleviate the step-graded portion on the substrate corresponding to the interconnection. More specifically, the coating is formed thick at the concave portion and thin at the convex portion on the substrate. Thus, the solution coating results in a planarized surface.

Heat treatment is then applied to vaporize the organic solvent. Also, polymerization proceeds to result in a planarized SOG film at the surface.

An SOG film is typically classified into an inorganic SOG film that does not include any organic component in the silicon compound, as represented by the following general formula (1), and an organic SOG film including an organic component in a silicon compound, as represented by the following general formula (2).

(n, X, Y: integer; R: alkyl group or aryl group

An inorganic SOG film has a disadvantage that it is more brittle than a silicon oxide film formed by CVD (Chemical Vapor Deposition) in addition to being highly hygroscopic. For example, a crack is easily generated during the heat treatment in an inorganic SOG film when thicker than 0.5 $\mu$m.

In contrast, although an organic SOG film is highly hygroscopic, the organic SOG film is suppressed in generation of a crack during heat treatment. Therefore, the organic SOG film can be formed to a thickness to approximately 0.5–1.0 $\mu$m. That is: The usage of an organic SOG film allows the formation of a thicker interlayer insulation film. Therefore, sufficient planarization can be achieved even for a great step-graded portion on a substrate.

The second method of planarization employs chemical mechanical polishing (referred to as CMP hereinafter).

The CMP method is a process including chemical action in addition to mechanical polishing. For example, after a thick insulation film such as of silicon oxide is formed on a substrate by plasma CVD and the like, the insulation film is polished down to a predetermined film thickness by CMP. In this CMP method, polishing is carried out while applying an abrasive with colloidal silica as the main component.

Planarization using an SOG film is advantageous over one using an insulation film deposited only by CVD in that favorable planarization is achieved. However, this planarization of the current level in which complete planarization cannot be achieved is not sufficient to meet the potential high standard for an interlayer insulation film as microfabrication proceeds and the scale of integration increases since an SOG film is formed from liquid. It is therefore difficult to completely correspond to the microfabrication and high integration of the devices.

Planarization according to CMP is advantageous over planarization using SOG film in that planarization of a higher level can be achieved. However, when only an insulation film (for example, a silicon oxide film) formed by CVD is used as an interlayer insulation film as in the conventional case, it is difficult to embed an insulation film in microminiaturized interconnection without any gap. A void may be generated. Even if the interconnections are filled with an insulation film without any gap, the capacitance between the interconnections will become greater since the insulation film formed by CVD has a high relative dielectric constant. This causes the problem that the operating speed of the LSI will be degraded due to RC delay.

An approach of achieving a favorable planarized surface of an appropriate level by planarization using an SOG film, and then polishing the planarized surface by CMP for further planarization is conventionally known.

However, this process of polishing an SOG film by CMP induces problems set forth in the following. The polishing rate of an SOG film by CMP is lower than that of the case where an insulation film formed by CVD is polished by CMP. Therefore, the throughput is reduced to increase the cost for fabrication. There is also a problem that a defect such as a scratch (generated during polishing) is easily generated at the surface of the SOG film.

SUMMARY OF THE INVENTION

An object of the present invention is to provide a fabrication method of a semiconductor device that allows improvement in planarization and polishing rate of an insulation film.

Another object of the present invention is to provide a fabrication method of a semiconductor device that can effectively prevent a defect from being generated in an insulation film during polishing working thereof.

According to an aspect of the invention, a fabrication method of a semiconductor device includes the following steps. First, impurities are introduced into a first insulation film. Then, planarization is carried out by polishing the surface of the first insulation film in which impurities are introduced. By carrying out polishing after impurities are introduced into the first insulation film, the polishing rate of the first insulation film by CMP is improved substantially to a level equal to the polishing rate of a silicon oxide film formed by CVD. Accordingly, the polish workability can be improved. Since polishing of the first insulation film is promoted by introduction of impurities thereto, the problem of generation of a defect such as a scratch during polishing of the first insulation film can be prevented effectively.

According to another aspect of the present invention, a method of fabricating a semiconductor device includes the following steps. A first insulation film is formed on a substrate. Then, a second insulation film is formed on the first insulation film. Impurities are introduced to at least the surface of the first insulation film before or after formation of the second insulation film. Planarization is achieved by polishing at least the second insulation film. By introducing impurities to at least the surface of the first insulation film, the portion where impurities are introduced has a polishing rate by CMP as high as that of a silicon oxide film formed by CVD. As a result, the polish workability of the first insulation film is improved. Also, a defect such as a scratch is not easily generated. In the fabrication method of the present aspect, the step of planarization can be carried out by polishing the first and second insulation films. The second insulation film can include a silicon oxide film formed by plasma CVD. Also, a photoresist film can be formed on the surface of a device before introducing impurities to the first insulation film, and introduce impurities to the first insulation film via the photoresist film. As a result, the depth of the introduced impurity is substantially set uniform since impurities are introduced via a photoresist that has an extremely flat surface. This provides the advantage that the boundary depth between the portion of the first insulation film where impurities are introduced and the portion where impurities are not introduced became uniform so that the end point for polishing can easily be detected by virtue of the portion without impurity introduced serving as a stopper with respect to polishing. In the fabrication method of the present aspect, a third insulation film can be formed on the surface of the device after polishing, and a fourth insulation film can be formed on the surface of the device prior to formation of the first insulation film. The formation of the third and fourth insulation films provides the advantage of increasing the mechanical strength of the insulation film. Also, the first insulation film can include a silicon oxide film material consisting of at least 1% of carbon in the fabrication method of the present aspect. Furthermore, the first insulation film can include a material having a contact angle of 30° and below of purified water with respect to the first insulation film. The first insulation film can also include an inorganic SOG film. The above-described polishing can be carried out according to chemical mechanical polishing. In this case, a surfactant is preferably used in the polishing step. It is also preferable to introduce impurities to the first insulation film by implantation. In this case, the impurities preferably include at least one element selected from the group consisting of argon, boron, nitrogen and phosphorus.

A method of fabricating a semiconductor device according to another aspect of the invention includes the following steps. First, a first insulation film is formed on an substrate. Impurities are introduced into at least a surface of the first insulation film. Planarization is effected by polishing the first insulation film. The introduction of impurities to at least the surface of the first insulation film provides the advantage that the portion of the first insulation film in which impurities are introduced is improved in the polishing rate. Also, generation of a defect such as a scratch during polishing can be prevented effectively. According to the fabrication method of the present aspect, impurities can be introduced only to the surface of the first insulation film. Also, a third insulation film can be formed on the surface of the device after polishing, or a fourth insulation film can be formed on the surface of the device before the first insulation film is formed. Formation of the third and fourth insulation films provides the advantage that the mechanical strength of the entire insulation film is improved. The first insulation film can include a silicon oxide material containing at least 1% of carbon. The first insulation film can include a material having a contact angle of not more than 30° of purified water with respect to the film. The first insulation film can include an inorganic SOG film. Also, the above polishing step can be carried out by chemical mechanical polishing. In this case, an abrasive liquid including a surfactant is preferably used. Impurities can be introduced into the first insulation film by implantation. In this case, the impurities preferably include at least one element selected from the group consisting of argon, boron, nitrogen and phosphorus.

A fabrication method of a semiconductor device according to still another aspect of the present invention includes the following steps. First, a first insulation film is formed on a substrate. A second insulation film is formed on the first insulation film. Planarization is effected by polishing at least the second insulation film using abrasive liquid including a surfactant according to chemical mechanical polishing. By using abrasive liquid including a surfactant in chemical mechanical polishing, abrasive liquid of favorable wettability can be obtained to carry out the polishing work more favorably. In this case, the surfactant is preferably a fatty acid compound. Impurities can be introduced to the first insulation film after this polishing step.

The abrasive liquid according to still another aspect of the present invention includes at least a surfactant used in a chemical mechanical polishing process. In this case, the surfactant preferably includes a fatty acid compound.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

First Embodiment

A fabrication process of a semiconductor device according to a first embodiment of the present invention (first to seventh steps) will be described with reference to FIGS. 1–7.

Figure 1:
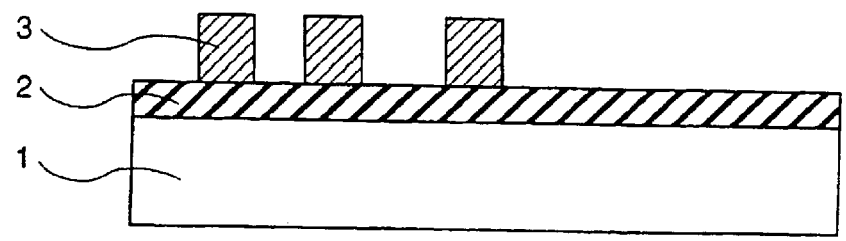
FIGS. 1–7 are sectional views of a semiconductor device for describing a fabrication method thereof according to a first embodiment of the present invention.

In the first step of FIG. 1, a silicon oxide film 2 is formed to a thickness of approximately 300–800 nm at the surface of a silicon substrate 1. Silicon oxide film 2 is formed so as to cover a gate electrode (not shown) and the like on silicon substrate 1. Silicon oxide film 2 can be formed according to an arbitrary method such as oxidation, CVD, and PVD.

A metal film (not shown) is formed by magnetron sputtering on silicon oxide film 2. This metal film is patterned to form a metal interconnection 3. Metal interconnection 3 has a layered structure of TiN (film thickness 20 nm)/Ti (film thickness 30 nm)/AlSiCu alloy (film thickness 550 nm)/TiN (film thickness 100 nm)/Ti (film thickness 50 nm) from the upper layer to the lower layer.

Figure 2:
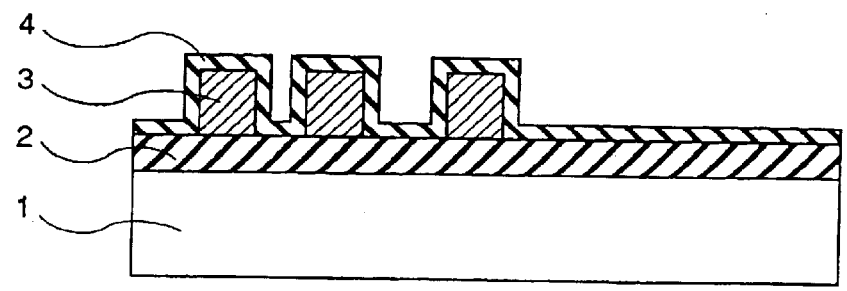

In the second step shown in FIG. 2, plasma CVD is carried out using TEOS (Tetra-ethoxy Silane:$Si(OC_2H_5)_4$) and oxygen to form a plasma TEOS oxide film 4 to a thickness of approximately 200 nm on metal interconnection 3. The film thickness of plasma TEOS oxide film 4 is adjusted according to the underlying step-graded portion. Plasma TEOS oxide film 4 is formed thick at a great underlying step-graded portion and thin at a small underlying step-graded portion.

Figure 3:
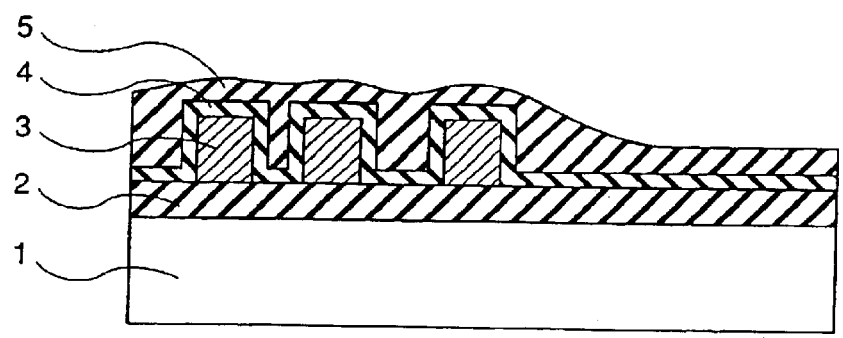

In the third step shown in FIG. 3, an organic SOG film 5 is formed on plasma TEOS oxide film 4. Organic SOG film 5 has a composition of $[CH_3Si(OH)_3]$. The total film thickness of organic SOG film 5 without the presence of a pattern is approximately 400 nm.

Organic SOG film 5 is formed as set forth in the following. First, an alcohol based solution of a silicon compound of the above composition (for example, IPA+acetone) is applied on substrate 1 in droplets while the substrate is rotated for 20 seconds at the rotational speed of 2300 rpm. As a result, a coating of this solution is formed on substrate 1. This alcohol based solution coating is formed so as to alleviate the step-graded portion on substrate 1 by being formed thick at the concave portion and thin at the convex portion. As a result, the surface of the alcohol based solution coating is planarized.

Then, in an atmosphere of nitrogen, a heat treatment is sequentially carried out for 1 minute at 100° C., 1 minute at 200° C., 1 minute at 300° C., 1 minute at 22° C., and 30 minutes at 300° C. By this sequential heat treatment, the alcohol system is vaporized and polymerization proceeds to form an organic SOG film of approximately 200 nm in thickness with a planarized surface. By repeating the process starting from the coating step to the heat treatment step once more, an organic SOG film 5 having a thickness of approximately 400 nm is obtained. This organic SOG film 5 is a silicon oxide containing at least 1% of carbon.

Figure 4:
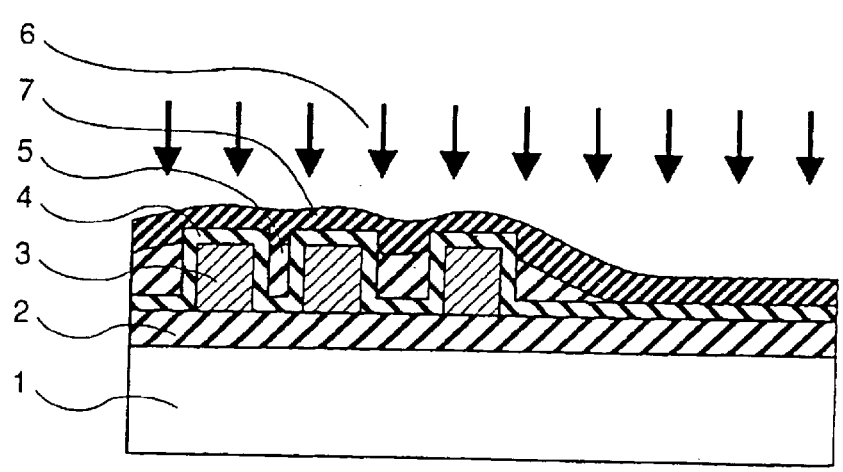

In the fourth step of FIG. 4, argon ions $(Ar^+)_6$ are doped into organic SOG film 5 by ion implantation. This ion implantation is carried out under the conditions of a dosage of $1 \times 10^{15}$ atms/$cm^2$ at the acceleration energy of 140 Kev. As a result, ions are introduced to a depth of approximately 300 nm from the surface layer of organic SOG film 5.

By implanting ions into organic SOG film 5, the organic component in the layer of organic SOG film 5 is decomposed, and the moisture and hydroxyl group included in the film are reduced. As a result, the portion of organic SOG film 5 in which ions are implanted is modified into an SOC film 7 (referred to as a modified SOG film hereinafter) that does not include any organic component and that includes only a slight amount of moisture and hydroxyl group.

Figure 20:
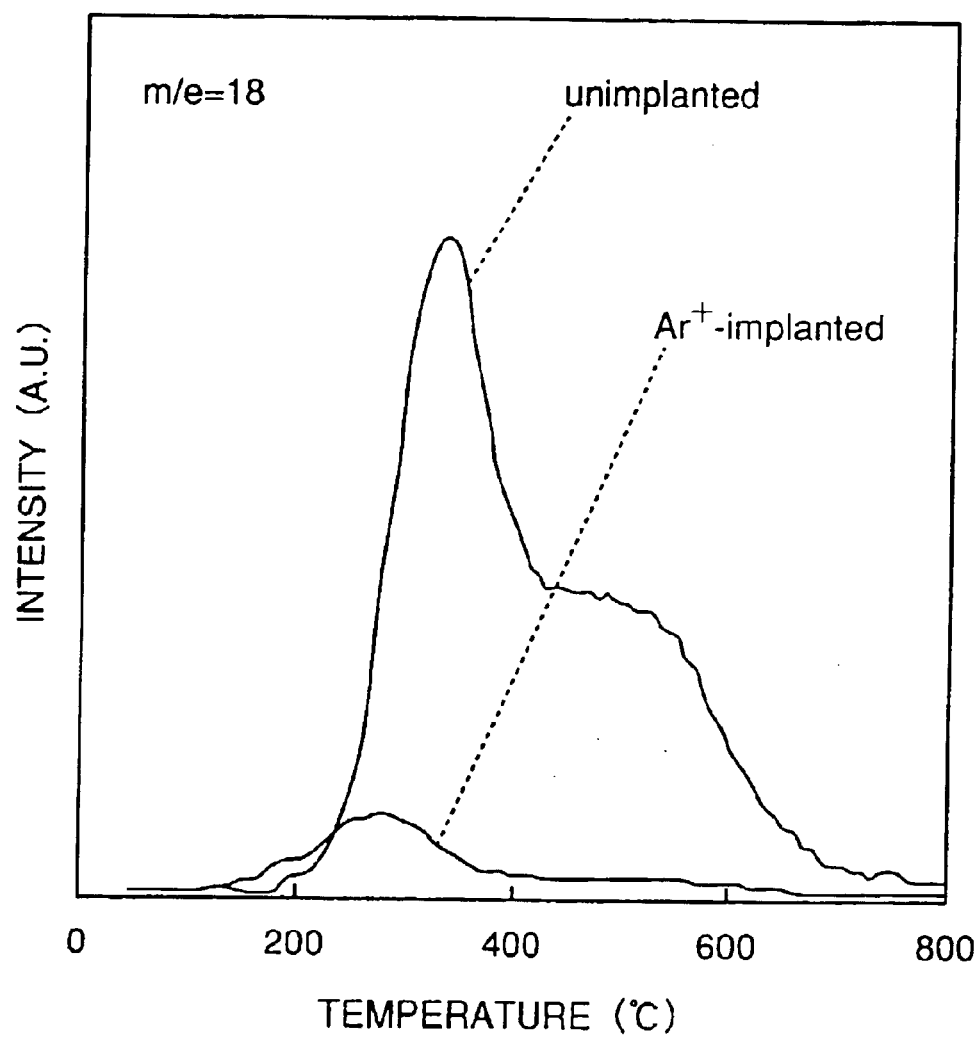
FIGS. 20–23 are diagrams for describing the characteristics of an embodiment of the present invention.

FIG. 20 shows results evaluated by subjecting organic SOG film 5 (untreated:unimplanted) and modified SOG film 7 (ion implantation processed: $Ar^+$-implanted) respectively to heat treatment for 30 minutes in an atmosphere of nitrogen according to TDS (Thermal Desorption Spectroscopy). In this case, ion implantation is carried out under the conditions of a dosage of $1 \times 10^{15}$ atms/$cm^2$ and an acceleration energy of 140 keV. FIG. 20 shows the amount of desorption for $H_2O$ (m/e=18). It is appreciated from FIG. 20 that desorption of $H_2O$ (m/e=18) is small for modified SOG film 7. This means that the moisture and the hydroxyl group included in organic SOG film 5 are reduced by the conversion of organic SOG film 5 into modified SOG film 7 by ion implantation.

Figure 21:
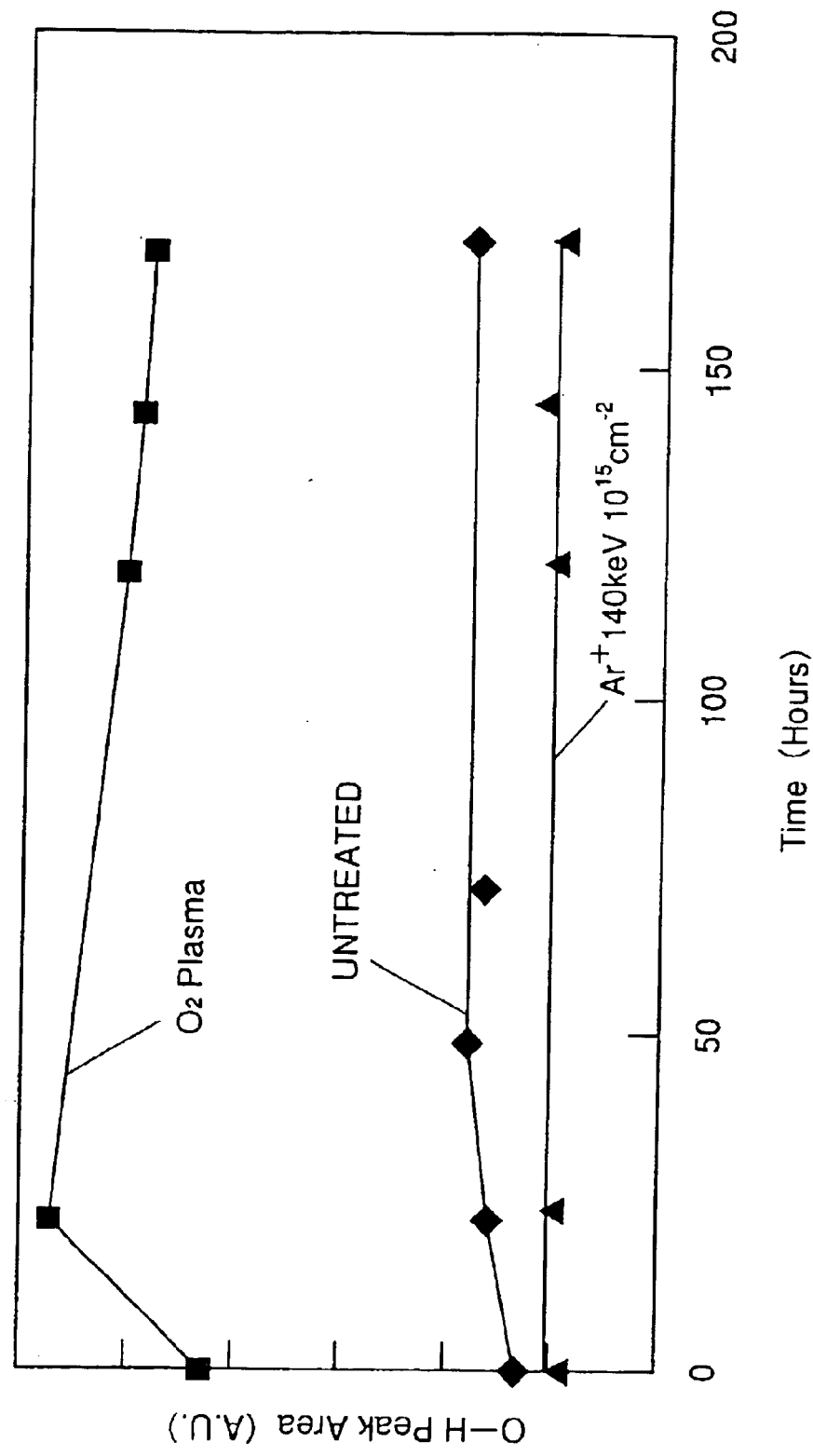

FIG. 21 shows results of the evaluation of moisture in the film carried out for the purpose of detecting the hygroscopic property of organic SOG film 5 and modified SOG film 7. Organic SOG film 5 (untreated), organic SOG film 5 exposed to oxygen plasma ($O_2$ plasma), and modified SOG film 7 ($Ar^+$) left in the atmosphere of a clean room were taken as the object. The amount of moisture in each film was indicated by the integrated density of the absorption (in the vicinity of 3500 $cm^{-1}$) of the O—H group in the infrared absorption spectrum using the FT-IR method (Fourier Transform Infrared Spectroscopy). The ion implantation was carried out under the conditions of a dosage of $1 \times 10^{15}$ atms/$cm^2$ and an acceleration energy of 140 keV.

It is appreciated from FIG. 21 that the moisture increases not only before and after the treatment, but even after 1 day when exposed to oxygen plasma. In contrast, modified SOG film 7 shows no increase in moisture after ion implantation. The increase in moisture is smaller than that of organic SOG film 5 even when left in the atmosphere of a clean room. In other words, modified SOG film 7 is less hydroscopic than organic SOG film 5.

Figure 22:
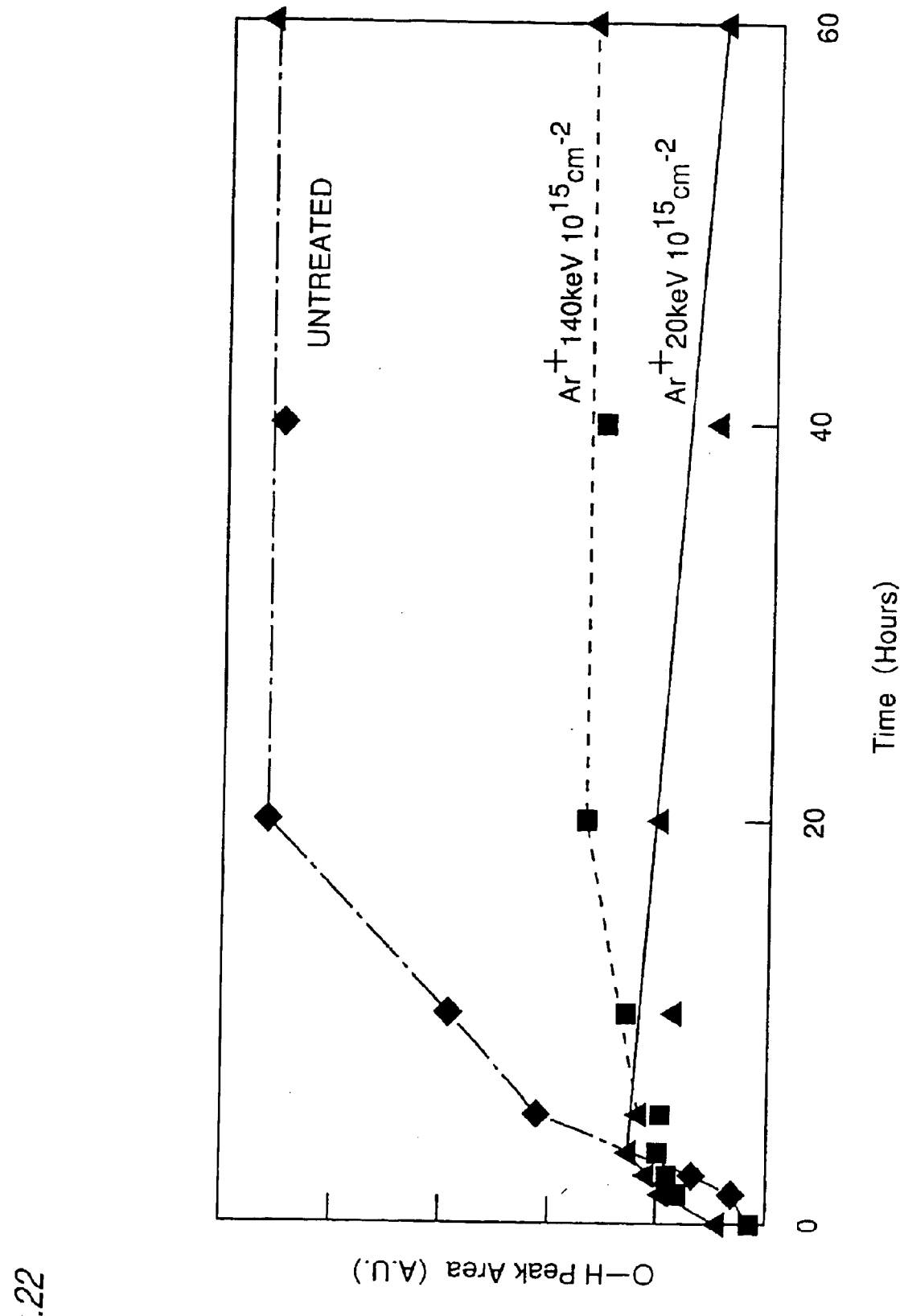

FIG. 22 shows the result of a pressure cooker test (PCT) carried out for the purpose of detecting the moisture permeability of modified SOG film 7 and organic SOG film 5. This pressure cooker test is a humidification test carried out in a saturated moisture ambient at 2 atmospheric pressure and 120° C. in the present embodiment. The integrated intensity of the absorption peak (in the vicinity of 3500 $cm^{-1}$) of the O—H in organic SOG film 5 was obtained and plotted over the PCT time using the FT-IR method.

A specimen ($Ar^+$ 20 keV) having only the surface modified by ion implantation was prepared and compared with a specimen having the film entirely modified ($Ar^+$ 140 KeV) and with a specimen that was not modified (organic SOG film 5:untreated). When organic SOG film 5 not modified is subjected to the pressure cooker test, the absorption intensity in the vicinity of 35000 $cm^{-1}$ (of the O—H group) shows a significant increase. In modified SOG film 7, increase of the absorption intensity in the vicinity of 3500 $cm^{-1}$ (of the O—H group) is small. The increase in the specimen in which only the surface is modified is substantially equal to that of the film that is completely modified.

It is understood from the above results that a layer that has moisture permeability suppressed can be formed by implanting ions.

Figure 5:
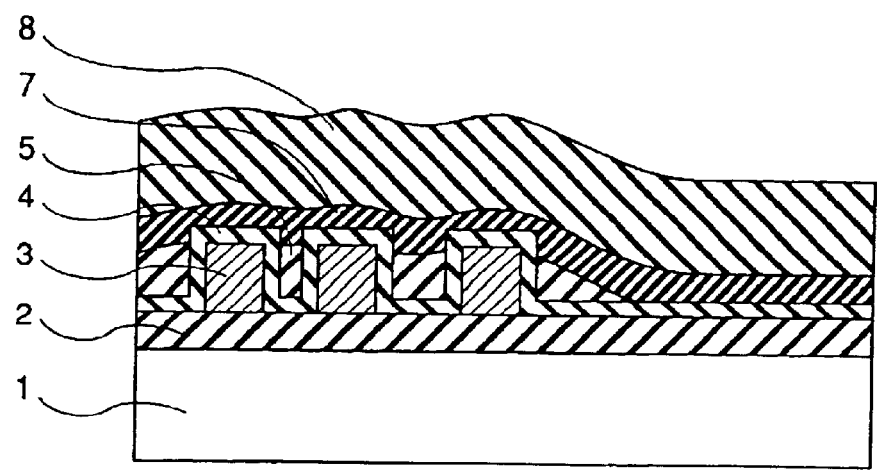

In the fifth step shown in FIG. 5, a plasma TEOS oxide film 8 is formed to a thickness of approximately 1–2 $\mu$m on modified SOG film 7 according to a procedure similar to that of plasma TEOS oxide film 4.

Figure 6:
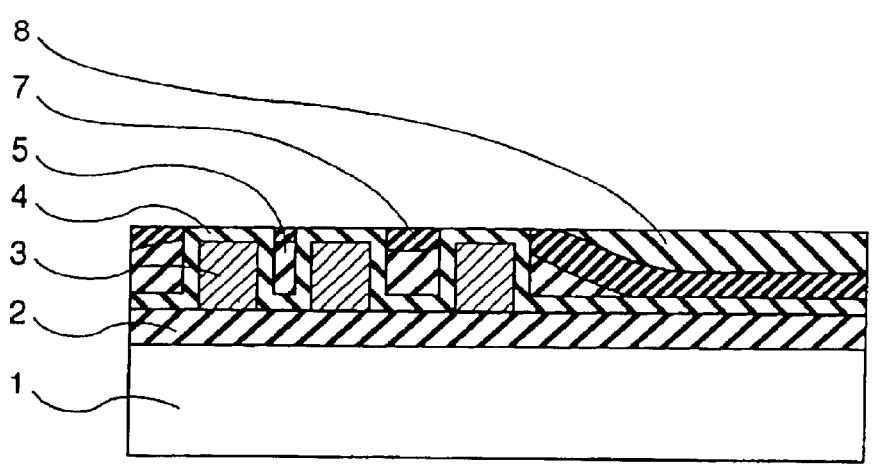

In the sixth step shown in FIG. 6, the surface of the device formed according to the first to fifth steps is polished by CMP. Here, an abrasive such as silica suspended into a potassium hydroxide aqueous solution or ammonia aqueous solution is used as the abrasive liquid.

Figure 23:
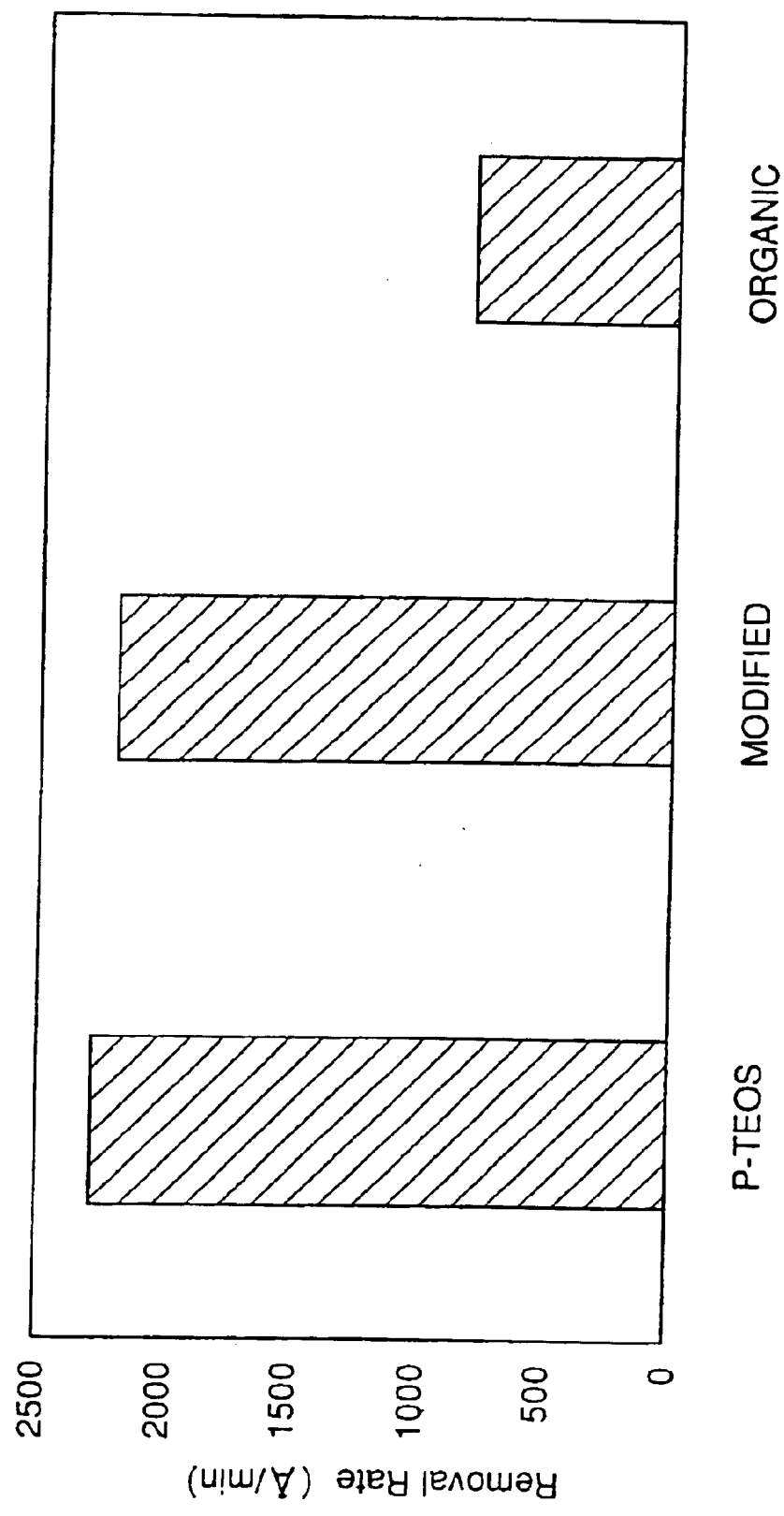
Figure 24:
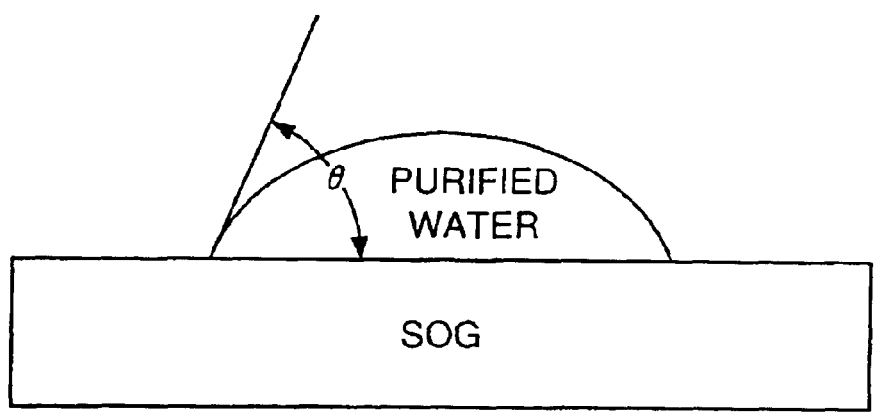
FIG. 24 is a schematic diagram for describing an embodiment of the present invention.

FIG. 23 shows the polishing rate (the polish speed) when modified SOG film 7, organic SOG film 5, and plasma TEOS oxide film 8 (P-TEOS) are respectively polished by CMP. It is appreciated from FIG. 23 that modified SOG film 7 and plasma TEOS oxide film 8 have substantially an equal level of polishing rate, and that organic SOG film 5 has a polishing rate that is several times smaller than the polishing rate of modified SOG film 7 and plasma TEOS oxide film 8. Therefore, when plasma TEOS oxide film 8 is polished so as to expose modified SOG film 7 by CMP, plasma TEOS oxide film 8 and modified SOG film 7 are both modified uniformly since the polishing rate is substantially equal. Accordingly, the polished surface is rendered extremely planarized. Furthermore, a defect such as a scratch caused in polishing an SOG film that does not have ions introduced is not easily generated in polishing modified SOG film 7.

The polishing operation by CMP can be carried out until plasma TEOS oxide film 4 is exposed as shown in FIG. 6, or terminated before exposure (not shown).

Figure 7:
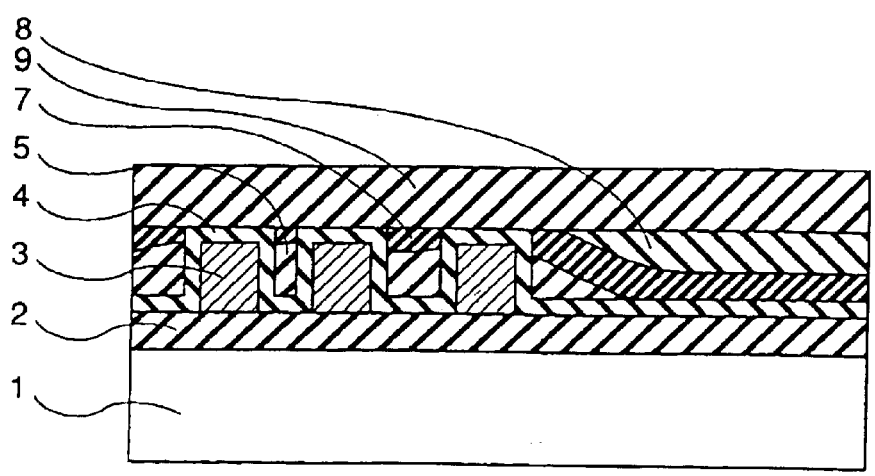

The seventh step will be described with reference to FIG. 7. It may be thought that modified SOG film 7 left after the sixth step of FIG. 6 does not have to have an insulation film further formed thereon since the water containing property and hygroscopic property are both extremely low. However, for the purpose of preventing any adverse effect from moisture included in the atmosphere and increasing the mechanical strength of the interlayer insulation film, a plasma TEOS oxide film 9 is formed to a thickness of approximately 200 nm on the film planarized by CMP according to a procedure similar to that of plasma TEOS oxide film 4. Plasma TEOS oxide film 9 exhibits favorable planarization since the underlying plane is flat.

An upper interconnection not shown connected to metal interconnection 3 via a contact hole (via hole) is formed on plasma TEOS oxide film 9. Since the planarization of interlayer insulation film 10 formed of plasma TEOS oxide film 4, organic SOG film 5, modified SOG film 7, plasma TEOS oxide film 8 and plasma TEOS oxide film 9 is extremely favorable, the process for forming the upper interconnection can be carried out more easily. Also, the probability of disconnection in the upper interconnection is reduced significantly.

Second Embodiment

The fabrication method of a semiconductor device according to a second embodiment of the present invention differs from the fabrication method of a semiconductor device of the first embodiment only in the step corresponding to the sixth step of the first embodiment shown in FIG. 6. The steps of the second embodiment corresponding to the first to fifth steps and the seventh step of the first embodiment are identical. Therefore, only the different step will be described for the second embodiment. The description of the remaining identical steps will not be repeated.

Figure 8:
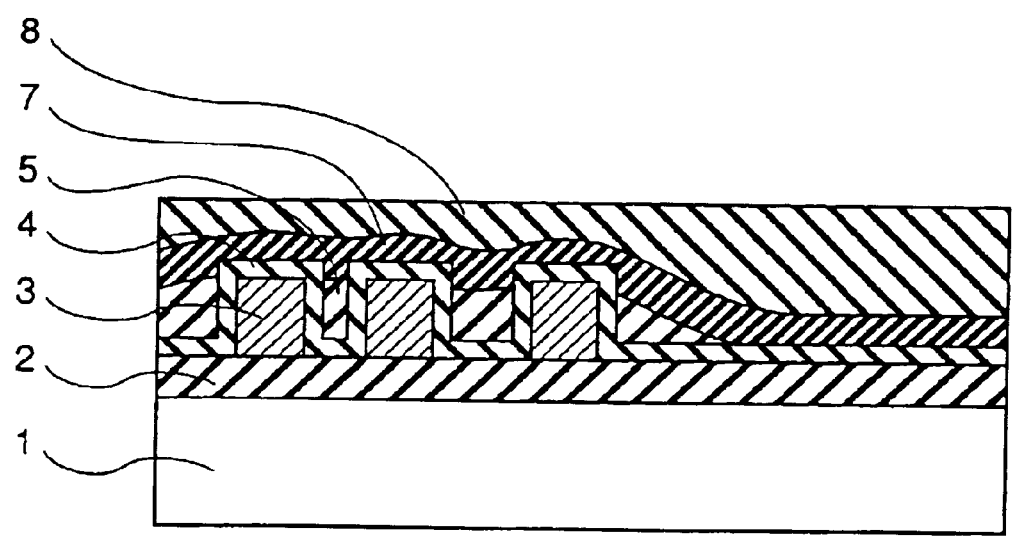
FIG. 8 is sectional view of a semiconductor device for describing a fabrication method thereof according to a second embodiment of the present invention.

According to the second embodiment of the present invention, the surface of a device formed according to steps similar to those of the first to fifth steps of the first embodiment is polished by CMP as shown in FIG. 8. The polishing operation is terminated before modified SOG film 7 is exposed so that plasma TEOS oxide film 8 remains all over the device. As a result, the step corresponding to the seventh step of the first embodiment shown in FIG. 7 (the step of depositing plasma TEOS oxide film 9) can be omitted.

Since modified SOG film 7 will not be exposed in the polishing operation of the surface of the device by CMP in the second embodiment, the advantage of the high polishing rate of modified SOG film 7 cannot be utilized. However, organic SOG film 8 must be changed into modified SOG film 7 taking into account the probability of exposure of the SOG film due to polishing error. There is also a possibility of contact failure in forming an electrode within a via hole if there is gas in the via hole from the SOG film, if exposed, at the side face of the via hole formed at a subsequent step. Organic SOG film 5 must be modified into SOG film 7 to prevent such disadvantages.

Third Embodiment

A fabrication method of a semiconductor device according to a third embodiment of the present invention will be described hereinafter with reference to FIGS. 9–14. Components corresponding to those of the first embodiment have the same reference characters allotted, and detailed description thereof will not be repeated.

Figure 9:
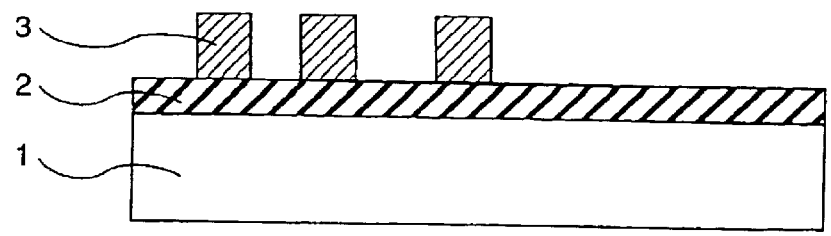
FIGS. 9–14 are sectional views of a semiconductor device for describing a fabrication method thereof according to a third embodiment of the present invention.

At the first step shown in FIG. 9, a silicon oxide film 2 is formed on the surface of a silicon substrate 1. A metal interconnection 3 is formed on silicon oxide film 2.

Figure 10:
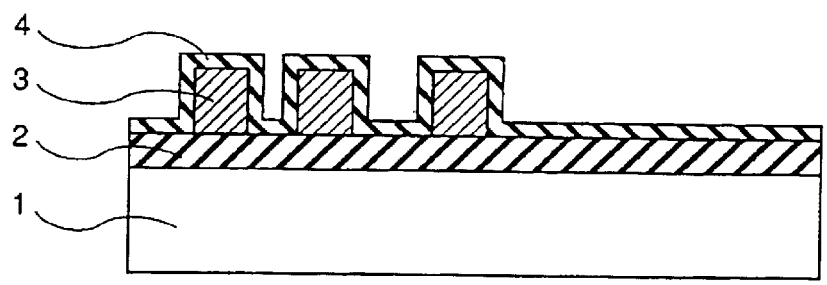

In the second step of FIG. 10, a plasma TEOS oxide film 4 is formed on metal interconnection 3.

Figure 11:
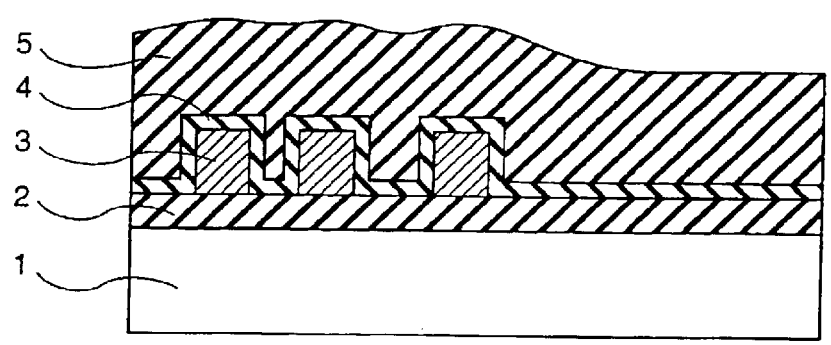

At the third step of FIG. 11, an organic SOG film 5 is formed on plasma TEOS oxide film 4. Here, organic SOG film 5 is formed thicker than in the fabrication method of the first embodiment shown in FIG. 3. More specifically, following application of an organic SOG film to a thickness of 300 nm, a heat treatment similar to that of the third step shown in FIG. 3 is carried out. By repeating this process 4 to 5 times, an organic SOG film 5 is formed to have a total film thickness of approximately 1.2 $\mu$m when there is no pattern.

Figure 12:
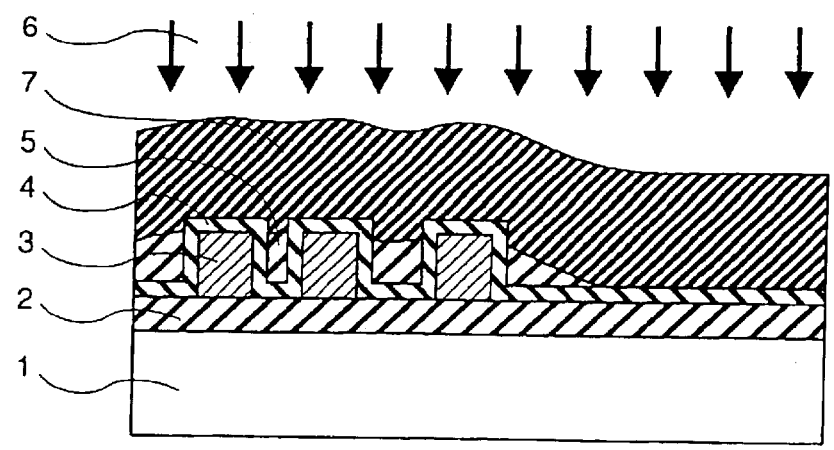

At the fourth step shown in FIG. 12, argon ions (Ar$^+$) 6 are introduced by ion implantation into organic SOG film 5. The nature of the film is modified to result in a modified SOG film 7.

Figure 13:
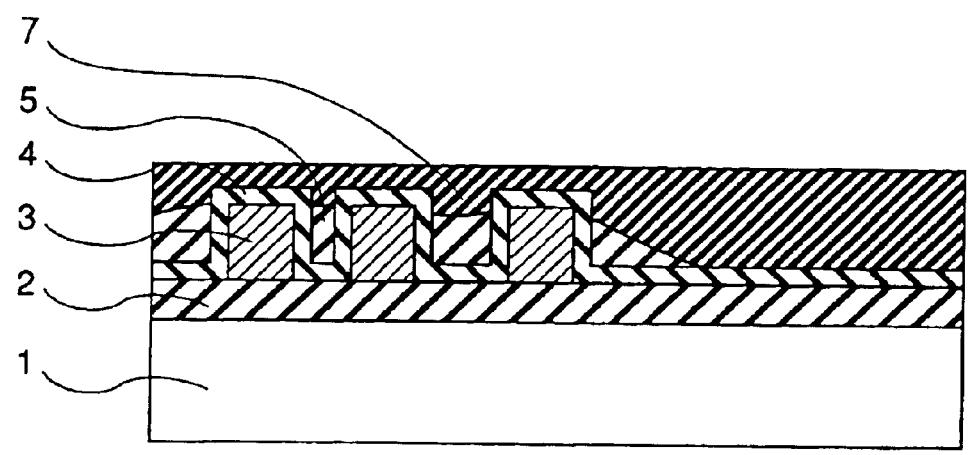

In the fifth step shown in FIG. 13, the surface of modified SOG film 7 is polished by CMP. This polish operation of modified SOG film 7 by CMP is carried out by a polishing rate substantially equal to that of a plasma TEOS oxide film. Since modified SOG film 7 is extremely low in hygroscopity, there is no adverse effect even when a great amount of abrasive liquid is used in the polish operation by CMP.

Figure 14:
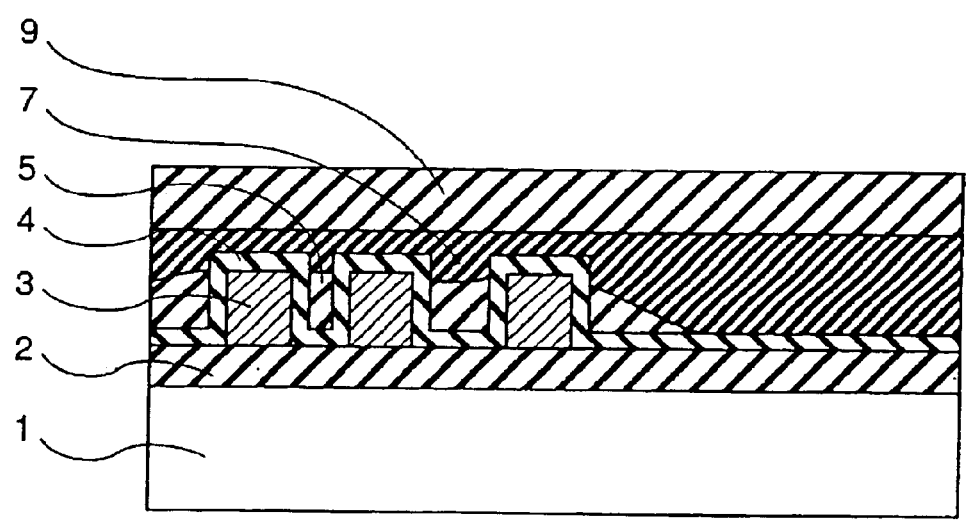

The sixth step will be described with reference to FIG. 14. It may be thought that an insulation film does not have to be formed on modified SOG film 7 since modified SOG film 7 left after the fifth step shown in FIG. 13 is extremely low in water containing property and hygroscopic property.

However, for the purpose of preventing any adverse effect from moisture included in the atmosphere and to increase the mechanical strength as an interlayer insulation film, a plasma TEOS oxide film 9 is formed on modified SOG film 7 planarized by CMP according to a procedure similar to that of plasma TEOS oxide film 4.

An upper interconnection not shown connected to metal interconnection 3 via a contact hole (via hole) is formed on plasma TEOS oxide film 9. Since the planarization of interlayer insulation film 10 formed of plasma TEOS oxide film 4, organic SOG film 5, modified SOG film 7, plasma TEOS oxide film 8 and plasma TEOS oxide film 9 can be set extremely favorable, the process of forming the upper interconnection can be carried out more easily. Also, the probability of disconnection in the upper interconnection can be reduced significantly.

Fourth Embodiment

A fabrication method of a semiconductor device according to a fourth embodiment of the present invention will be described hereinafter with reference to FIGS. 15–19. The fabrication method of the fourth embodiment differs from the fabrication method of the first embodiment only in the step corresponding to the fourth to seventh steps of the first embodiment shown in FIGS. 4–7. The prior steps corresponding to the first to third steps are identical. Therefore, only the different steps will be described, and description of the other similar steps will not be repeated.

Figure 15:
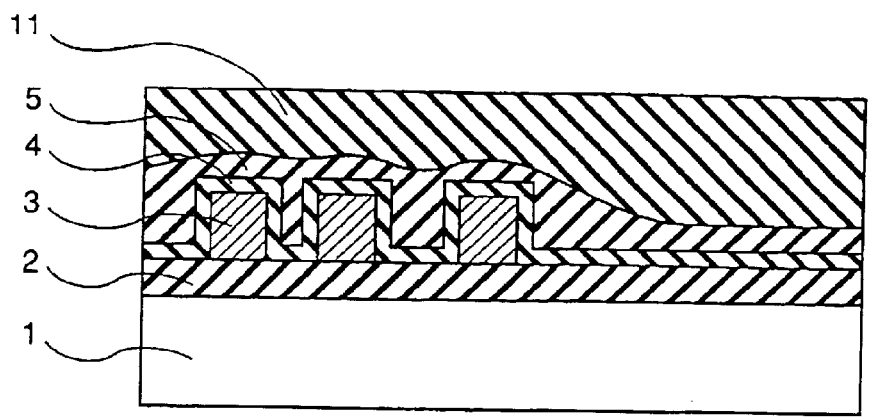
FIGS. 15–19 are sectional views of a semiconductor device for describing a fabrication method according to a fourth embodiment of the present invention.

A structure as shown in FIG. 3 is completed according to a process similar to that of the first embodiment shown in FIGS. 1–3. Then, a photoresist film 11 is applied on organic SOG film 5 as shown in FIG. 15. Photoresist film 11 is formed so as to alleviate the step-graded portion on the substrate similar to organic SOG film 5. More specifically, photoresist film 11 is formed thick at a concave portion and thin at a convex portion. Therefore, the surface thereof is extremely flat.

Figure 16:
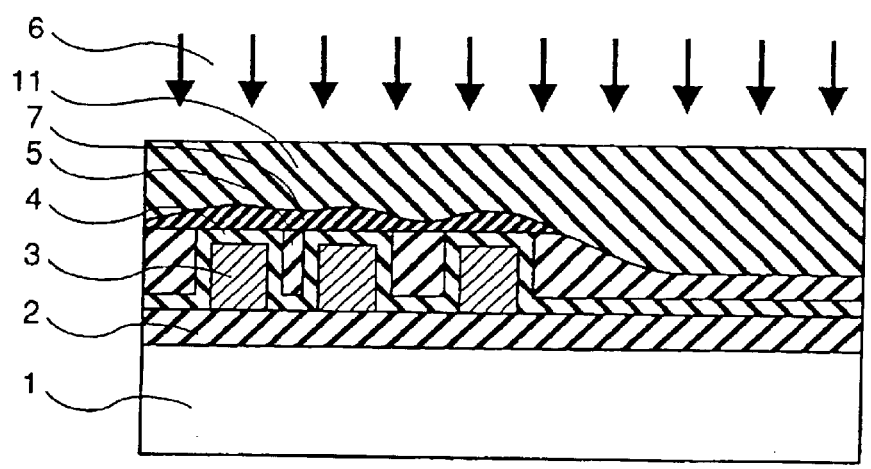

Then, argon ions ($Ar^+$) 6 are introduced by ion implantation to organic SOG film 5 as shown in FIG. 16. This ion implantation is carried out under the condition that only the surface layer (the portion above the topmost plane of plasma TEOS oxide film 4) through photoresist film 11. The portion implanted with ions is modified into SOG film 7.

The depth of the ions implanted is substantially uniform when ion implantation is carried out through photoresist film 11 since the surface thereof is extremely flat. Therefore, the bottom face of the modified region of the organic SOG film is planarized. Photo resist film 11 is preferably formed of a material having an implantation range substantially equal to that of organic SOG film 5.

Figure 17:
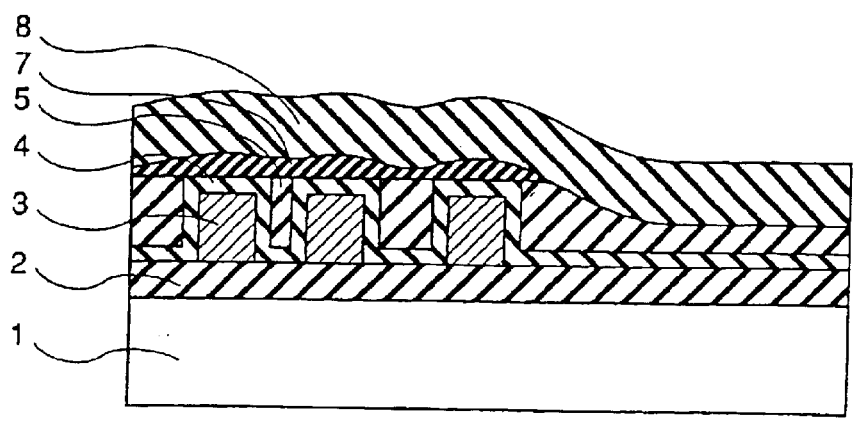

Following the above ion implantation, photoresist film 11 is removed by ashing. Then, a plasma TEOS oxide film 8 is formed on modified SOG film 7 (organic SOG film 5) as shown in FIG. 17.

Figure 18:
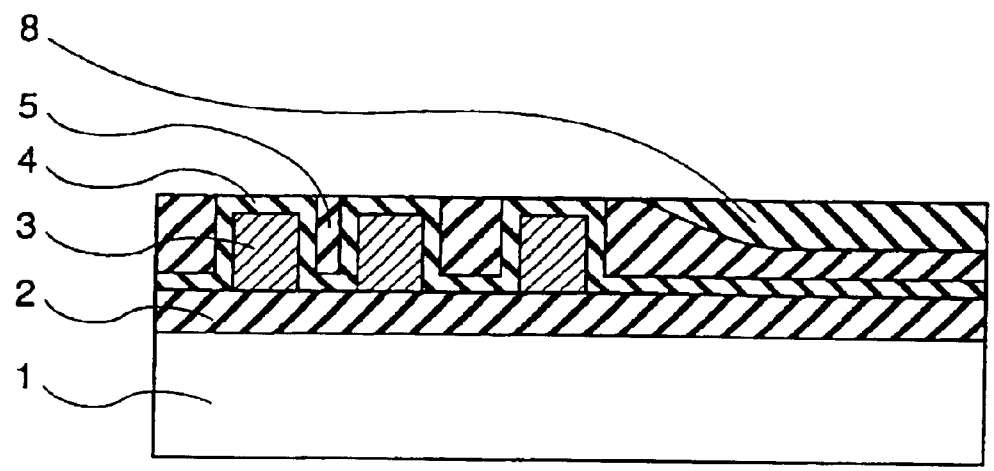

By polishing the surface of the device formed by the above steps until plasma TEOS oxide film 4 is exposed by CMP, a structure as shown in FIG. 18 is obtained. Since the lower face of modified SOG 7 is extremely flat, organic SOG film 5 not modified is exposed due to its low polishing rate simultaneous to the exposure of plasma TEOS oxide film 4. This organic SOG film 5 serves as a polish stopper to facilitate detection of the end point of polishing.

Figure 19:
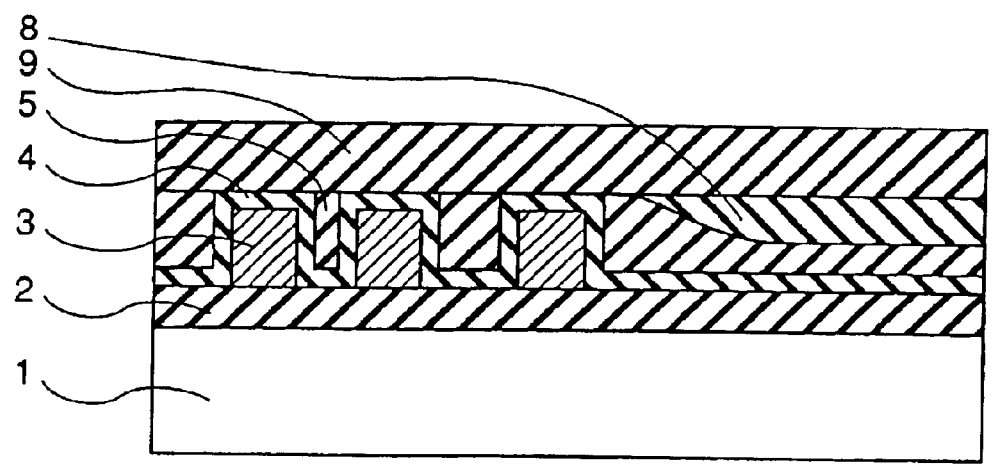

Then, a plasma TEOS oxide film 9 is formed on the surface of the polish device as shown in FIG. 19. An upper interconnection not shown connected to metal interconnection 3 via a contact hole (via hole) is formed on plasma TEOS oxide film 9.

Although adjustment is provided so that modified SOG film 7 and plasma TEOS oxide film 8 have substantially an equal polishing rate in the above embodiments, the expected object of the present invention is to facilitate polishing of organic SOG film 5. The inventors of the present invention confirmed the relationship between the wettability of organic SOG film 5 and the polishing rate by CMP according to experiments. The contact angle θ of purified water (having a resistivity of 18 MΩ·cm at 25° C.) on an organic SOG film was measured so as to indicate the wettability of the organic SOG film. This contact angle is the angle θ between a drop of purified water on the organic SOG film and the underlying film (SOG film).

Figure 25:
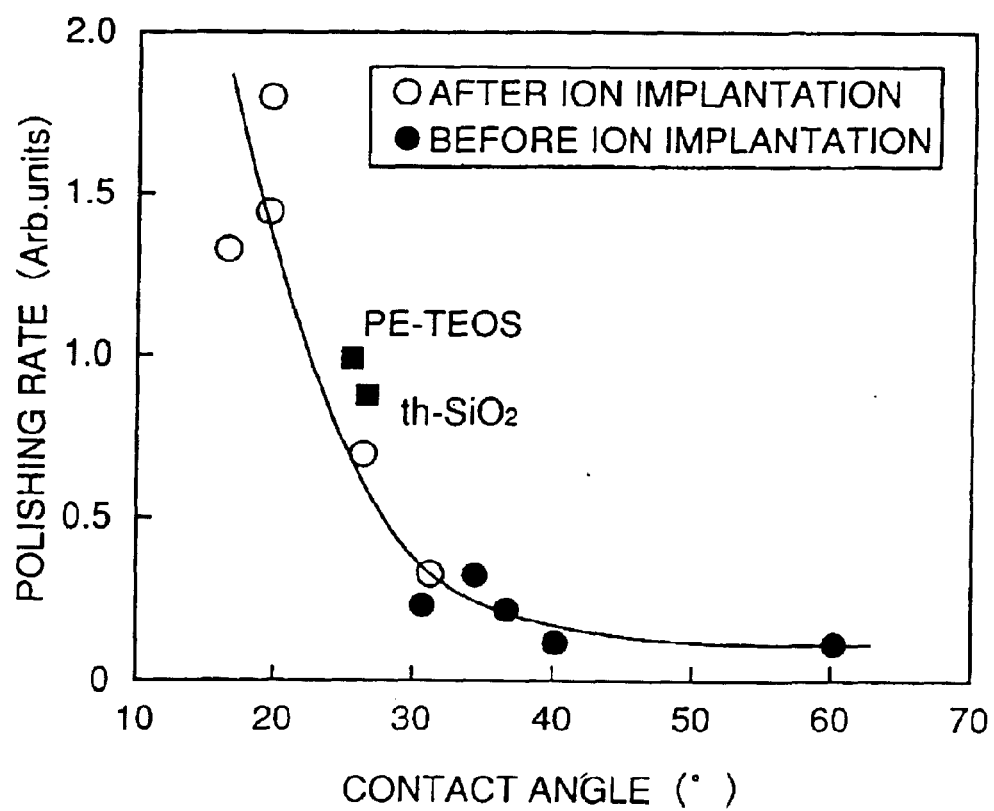
FIG. 25 is a diagram for describing the characteristics of an embodiment of the present invention.

FIG. 25 shows the polishing rate of five organic SOG films having different contact angles (solid circle in drawing), and the relationship between the contact angle and the polishing rate of each film when ions are implanted into each organic SOG film under the same condition (open circle in drawing).

It is appreciated that the polishing rate is increased as the contact angle becomes smaller from the border of 30°. This phenomenon is probably due to the fact that the great amount of the methyl group in the organic SOG film responsible for low wettability is decomposed by ion implantation to result in better wettability. More specifically, a high polishing rate can be obtained by implanting ions into the organic SOG film to set the contact angle to be not more than 30°.

The wettability (contact angle) of the organic SOG film (modified SOG film) can be adjusted by altering the dosage. For example, by setting the contact angle to 25°, a polishing rate of a level identical to that of the plasma TEOS oxide film (PE-TEOS) and the thermal oxide film (th-$SiO_2$) can be obtained.

Fifth Embodiment

In the first to fourth embodiments, the polishing rate of organic SOG film 5 (modified SOG film 7) can be increased by implanting ions to organic SOG film 5. In the fifth embodiment of the present invention, the polishing rate of organic film 5 can be increased by improving the wettability of the employed abrasive liquid per se on organic SOG film 5. Abrasive liquid having a small contact angle when dropped on organic SOG film 5 is used to improve the wettability of the abrasive liquid per se with respect to organic SOG film 5.

Abrasive liquid of favorable wettability can be obtained by adding 0.1–0.5 mol/ℓ, for example, of a surfactant (for example, a fatty acid compound such as formic acid, acetic acid, propionic acid, and butyric acid) into the abrasive liquid (an abrasive such as silica suspended in potassium hydroxide aqueous solution or ammonia aqueous solution) used in the previous first to fourth embodiments.

Modified SOG film 7 has the advantage that the film becomes less hygroscopic as well as moisture being removed therefrom, in addition to the increase in the polishing rate. Therefore, ions should be implanted into organic SOG film 5 after CMP in order to enjoy the above advantages.

Sixth Embodiment

A fabrication method of a semiconductor device according to a sixth embodiment of the present invention will be described hereinafter with reference to FIGS. 26–32. The sixth embodiment differs from the previous first to fifth embodiments in that impurity ions are implanted after the polish operation by CMP. Components identical to those of the first embodiment have the same reference characters allotted, and detailed description thereof will not be repeated.

Figure 26:
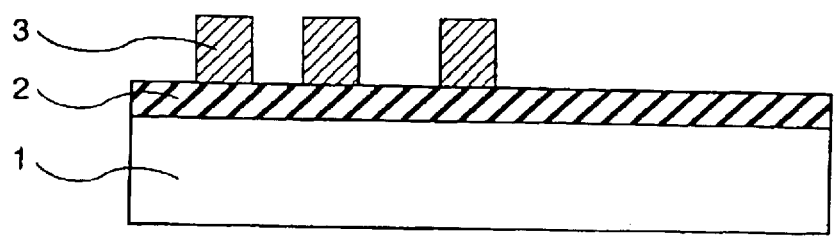
FIGS. 26–32 are sectional views of a semiconductor device for describing a fabrication method thereof according to a sixth embodiment of the present invention.

Referring to FIG. 26, a silicon oxide film 2 is formed on the surface of silicon substrate 1. A metal interconnection 3 is formed on silicon oxide film 2.

Figure 27:
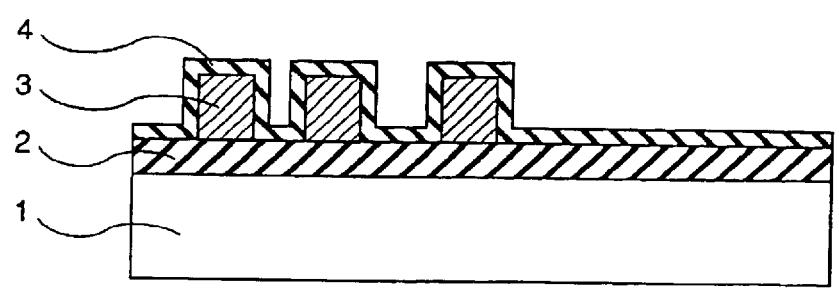

Referring to FIG. 27, a plasma TEOS oxide film 4 is formed on metal interconnection 3.

Figure 28:
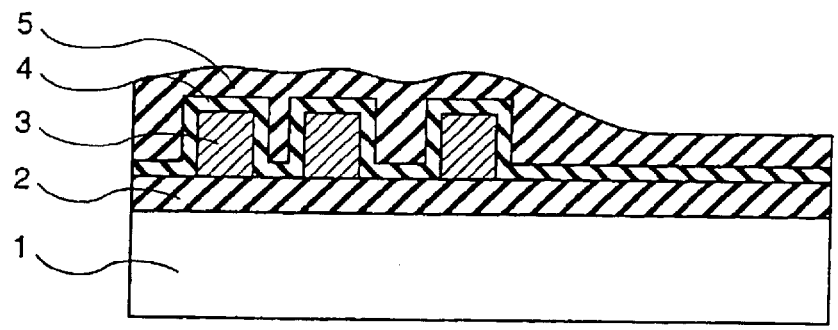

Referring to FIG. 28, an organic SOG film 5 is formed on plasma TEOS oxide film 4.

Figure 29:
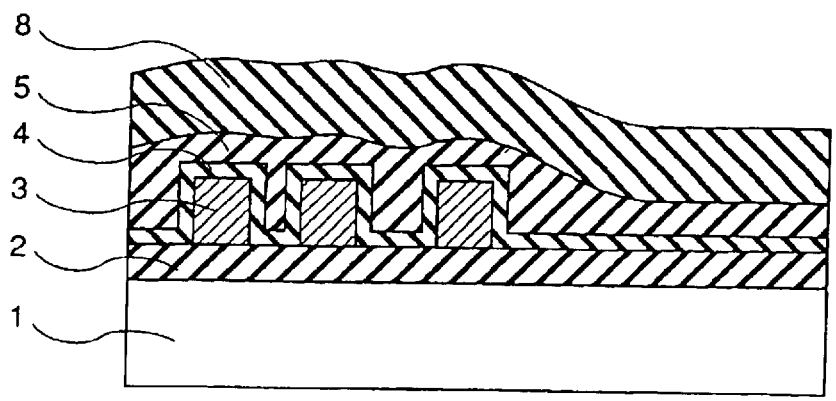

Referring to FIG. 29, a plasma TEOS oxide film 8 is formed to a thickness of 1–2 $\mu$m on organic SOG film 5 according to a procedure similar to that of plasma TEOS oxide film 4.

Figure 30:
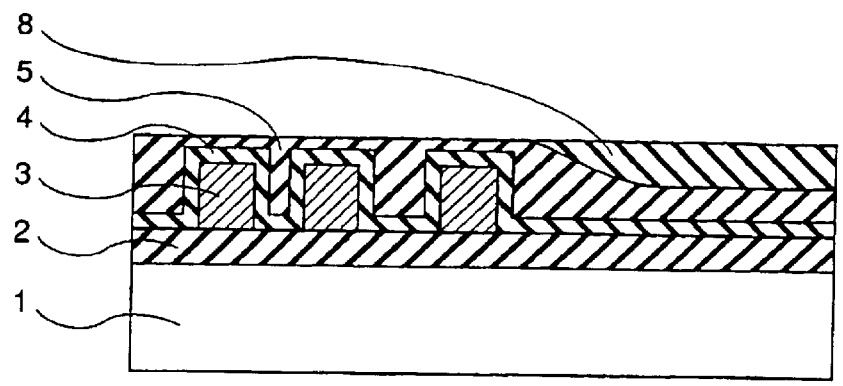

Referring to FIG. 30, the surface of the device formed according to the above steps is polished by CMP. Here, a slurry including a surfactant is used as the abrasive liquid. This polish operation by CMP is terminated before plasma TEOS oxide film 4 is exposed as shown in FIG. 30.

Figure 31:
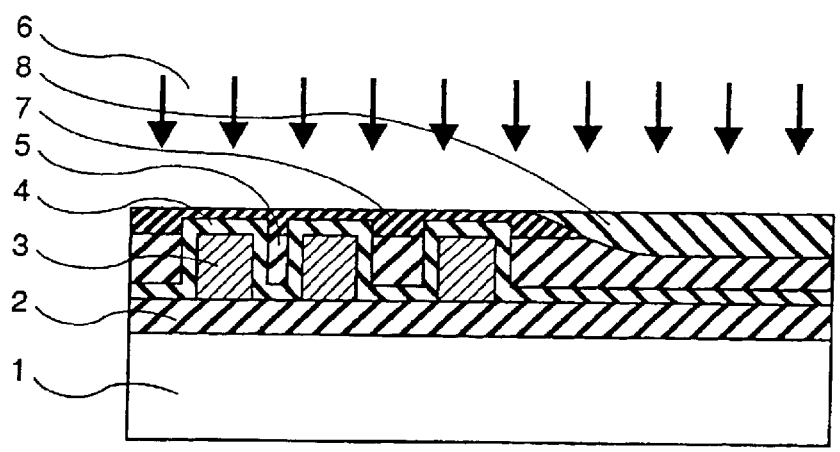

Referring to FIG. 31, argon ions (Ar$^+$) are doped to the surface of organic SOG film 5 by ion implantation. This ion implantation is carried out under the conditions so that ions are implanted at least to the portion exposed at the time of formation of a via hole. Modifying organic SOG film 5 by implanting ions to the portion that will be exposed at the time of via hole formation provides the advantage of preventing contact failure in forming an electrode in a via hole caused by gas from the SOG film when exposed at the sidewall of the via hole formed at a subsequent step.

Figure 32:
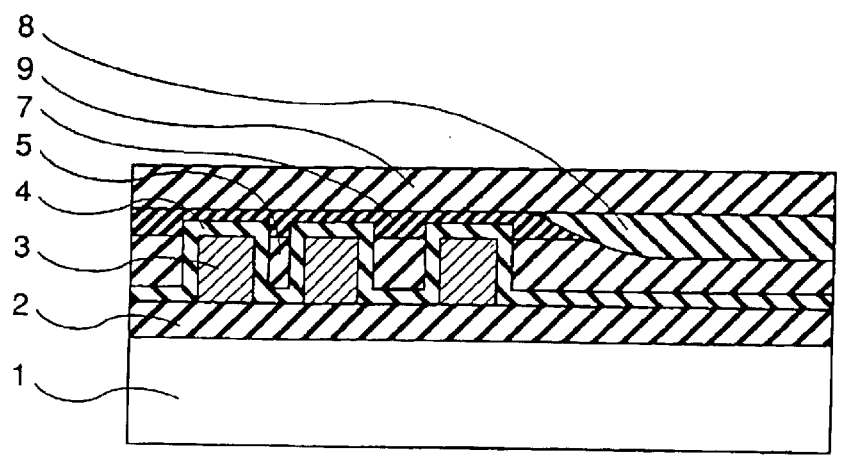

Referring to FIG. 32, a plasma TEOS oxide film 9 is formed to a thickness of approximately 200 nm, for example, on the film planarized by CMP by a procedure similar to that of plasma TEOS oxide film 4 for the purpose of preventing any adverse effect from the moisture in the atmosphere and to further increase the mechanical strength as an interlayer insulation film.

An upper interconnection not shown connected to metal interconnection 3 via a contact hole (via hole) is formed on plasma TEOS oxide film 9.

Since the planarization of interlayer insulation film 10 formed of plasma TEOS oxide film 4, organic SOG film 5, modified SOG film 7, plasma TEOS oxide film 8 and plasma TEOS oxide film 9 can be made favorable, the process for forming the upper layer interconnection can be carried out more easily. Also, the probability of disconnection in the upper layer interconnection can be reduced.

The present invention is not limited to the above-described embodiment. Similar advantages can be achieved by implementation as set forth in the following.

(1) Polyimide or polyimide composed with siloxane can be used instead of organic SOG film 5.

(2) An inorganic SOG film can be used instead of organic SOG film 5 to which ion implantation is carried out thereto. This provides the advantage that the moisture and hydroxyl group included in the inorganic SOG film can be reduced.

(3) A silicon oxide film formed by a method other than plasma CVD (such as atmospheric CVD, low pressure CVD, ECR plasma CVD, photoexcitation CVD, TEOS-CVD, PVD) can be used instead of the silicon oxide films of plasma TEOS oxide film 4, 8 and 9. In this case, the gas used in the atmospheric pressure CVD method is monosilane and oxygen ($SiH_4+O_2$). The film growth temperature is not more than 400° C. The gas used for low pressure CVD is monosilane and nitrous oxide ($SiH_4+N_2O$). The film growth temperature thereof is not more than 900° C.

(4) Each of plasma TEOS oxide films 4, 8 and 9 can be replaced with another insulation film (such as silicon nitride film and silicate glass film) having a high mechanical strength in addition to the property for blocking moisture and the hydroxyl group. This insulation film can be formed by an arbitrary method such as CVD and PVD.

(5) In the above-described embodiments, argon ions are used for ion implantation into organic SOG film 5. However, any ion that can modify the property of organic SOG film 5 can be used. More specifically, ion of a relatively small mass such as argon, boron, nitrogen and phosphorus is suitable. Additionally, the following ions can be expected to provide sufficient effects.

① Inert gas ions other than argon (such as helium ion, neon ion, krypton ion, xenon ion and radon ion) can be used. Since inert gas does not react with the organic SOG film, there is no probability of advert influence by ion implantation.

② Element unitary ions of the groups IIIb, IVb, Vb, VIIb and VIIb other than boron and nitrogen, and compound ions thereof can be used. Particularly, the element unitary ions and compound ions of oxygen, aluminum, sulfur, chlorine, gallium, germanium, arsenic, selenium, bromine, antimony, iodine, indium, tin, tellurium, lead, and bismuth preferably can be used.

Particularly, metal element ions can suppress the dielectric constant to a low level for organic SOG film 5 subjected to ion implantation.

③ Element unitary ions of the groups IVa, Va, and compound ions thereof can be used. Particularly, element unitary ions of titanium, vanadium, niobium, hafnium, and tantalum and compound ions thereof are preferable. Since the dielectric constant of the oxide of the element of the groups IVa and Va is high, the dielectric constant of organic SOG film 5 subjected to ion implantation increases. However, this is of no particular problem in practice except for the cases where an interlayer insulation film of a low dielectric constant is required.

④ A plurality of types of the above-described ions can be used in combination. In this case, a further superior effect can be obtained by the synergism of each ion.

(6) Modified SOG film 7 can be subjected to a heat treatment. In this case, the number of dangling bonds in modified SOG film 7 is reduced to result in a lower hygroscopic property. Therefore, moisture permeability is further reduced.

(7) In the above-described embodiments, ions are implanted into organic SOG film 5. The present invention is not limited to ions, and electrons, atoms, molecules, or particles can be introduced. In the present invention, these are generically referred to as "impurities".

(8) Modified SOG film 7 is extremely superior than organic SOG film 5 in hygroscopic property, water resistance, and mechanical strength. Therefore, plasma TEOS oxide film 9 can be omitted appropriately in each of the above-described embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A fabrication method of a semiconductor device comprising the steps of:

forming a first insulation film, including at least an organic SOG film, on a substrate, forming a second insulation film on said first insulation film, introducing impurities at least to a surface of said first insulation film either before or after forming said second insulation film, and effecting planarization by polishing at least said second insulation film, wherein said step of introducing impurities comprises the steps of forming a photoresist on a surface of a device before impurities are introduced to said first insulation film, and introducing impurities into said first insulation film via said photoresist film.

2. A fabrication method of a semiconductor device comprising the steps of:

forming a first insulation film on a substrate, forming a second insulation film on said first insulation film, introducing impurities at least to a surface of said first insulation film either before or after forming said second insulation film, effecting planarization by polishing at least said second insulation film, and forming a third insulation film on a surface of a device after said first polishing.

3. A fabrication method of a semiconductor device comprising the steps of:

forming a first insulation film, including at least an organic SOG film, on a substrate, forming a second insulation film on said first insulation film, introducing impurities at least to a surface of said first insulation film either before or after forming said second insulation film, and effecting planarization by polishing at least said second insulation film.

4. The fabrication method of a semiconductor device according to claim 3, wherein said step of planarization comprises the step of effecting planarization by polishing said first and second insulation films.

5. The fabrication method of a semiconductor device according to claim 3, wherein said second insulation film includes a silicon oxide film formed by plasma CVD.

6. The fabrication method of a semiconductor device according to claim 3, further comprising the step of:

forming a third insulation film on a surface of a device before said first insulation film is formed.

7. The fabrication method of a semiconductor device according to claim 3, wherein said first insulation film includes a material having a contact angle of purified water of not more than 30° with respect to said first insulation film.

8. The fabrication method of a semiconductor device according to claim 3, wherein said first insulation film includes an inorganic SOG film.

9. The fabrication method of a semiconductor device according to claim 3, wherein said polishing is carried out by chemical mechanical polishing.

10. The fabrication method of a semiconductor device according to claim 9, wherein a surfactant is used in said polishing step.

11. The fabrication method of a semiconductor device according to claim 3, wherein said step of introducing impurities comprises the step of introducing impurities into said first insulation film by implantation.

12. The fabrication method of a semiconductor device according to claim 11, wherein said impurities include at least one element selected from the group consisting of argon, boron, nitrogen and phosphorus.

13. The fabrication method of a semiconductor device according to claim 6, wherein said step of introducing impurities comprises the step of introducing impurities only to a surface of said first insulation film.

14. A fabrication method of a semiconductor device comprising the steps of:

forming a first insulation film on a substrate, introducing impurities at least to a surface of said first insulation film, effecting planarization by polishing said first insulation film, and forming a second insulation film on a surface of a device after said polishing.

15. A fabrication method of a semiconductor device comprising the steps of:

forming a first insulation film, including at least an organic SOG film, on a substrate, introducing impurities at least to a surface of said first insulation film, effecting planarization by polishing said first insulation film, and forming a second insulation film on a surface of a device before said first insulation film is formed.

16. The fabrication method of a semiconductor device according to claim 15, further comprising the step of:

forming a second insulation film on a surface of a device before said first insulation film is formed.

17. The fabrication method of a semiconductor device according to claim 6, wherein said first insulation film includes a material having a contact angle of purified water of not more than 30° with respect to said first insulation film.

18. The fabrication method of a semiconductor device according to claim 6, wherein said polishing is carried out by chemical mechanical polishing.

19. The fabrication method of a semiconductor device according to claim 6, wherein a surfactant is used in said polishing step.

20. The fabrication method of a semiconductor device according to claim 6, wherein said step of introducing impurities comprises the step of introducing impurities into said first insulation film by implantation.

21. The fabrication method of a semiconductor device according to claim 6, wherein said impurities include at least one element selected from the group consisting of argon, boron, nitrogen and phosphorus.

22. A fabrication method of a semiconductor device comprising the steps of:

forming a first insulation film, including at least an organic SOG film, on a substrate, forming a second insulation film on said first insulation film, effecting planarization by polishing at least said second insulation film by chemical mechanical polishing using an abrasive liquid including a surfactant, and introducing impurities into said first insulation after said polishing step.

23. The fabrication method of a semiconductor device according to claim 22, wherein said surfactant includes a fatty acid compound.

24. A fabrication method of a semiconductor device, comprising the steps of:

forming a first insulation film including at least an SOG film on a substrate, forming a second insulation film on said first insulation film, introducing impurities at least to a surface of said first insulation film either before or after forming said second insulation film, effecting planarization by polishing at least said second insulation film, and forming a third insulation film on a surface of a device before said first insulation film is formed.

* * * * *